United States Patent
Ghosh et al.

[11] Patent Number: 5,863,607
[45] Date of Patent: Jan. 26, 1999

[54] HYBRID METAL-CERAMIC COATING APPARATUS AND METHOD

[75] Inventors: Syamal K. Ghosh; Dilip K. Chatterjee, both of Rochester; Edward P. Furlani, Lancaster, all of N.Y.

[73] Assignee: Eastman Kodak Company, Rochester, N.Y.

[21] Appl. No.: 826,539

[22] Filed: Apr. 3, 1997

Related U.S. Application Data

[60] Provisional application No. 60/005,501, Sep. 7, 1995.

Related U.S. Application Data

[63] Continuation-in-part of Ser. No. 612,362, Mar. 7, 1996, abandoned.
[51] Int. Cl.⁶ .................................. B05D 1/30; B05C 5/00
[52] U.S. Cl. .................. 427/255; 427/402; 427/420; 118/324; 118/410; 118/411; 118/DIG. 4
[58] Field of Search .................................. 427/255, 402, 427/420; 118/324, 410, 411, DIG. 4

[56] References Cited

U.S. PATENT DOCUMENTS

| | | | |
|---|---|---|---|
| 5,275,660 | 1/1994 | Ozaki et al. | 118/411 |
| 5,484,629 | 1/1996 | Ghosh et al. | 427/255 |

FOREIGN PATENT DOCUMENTS 361167  4/1990  European Pat. Off. .

OTHER PUBLICATIONS

Apr. 1994, Research Disclosure No. 36006, "Coating Apparatus and Method " pp. 183–185.

*Primary Examiner*—Katherine A. Bareford
*Attorney, Agent, or Firm*—Arthur H. Rosenstein

[57] ABSTRACT

A coating hopper (10) for coating a radiation-sensitive emulsion on a photographic support (24) is fabricated from hopper bars (12) comprising an inlet slot (16) and a discharge slot (18), said bar (12) comprising a body and hopper lip (22), wherein the body of the bar comprises a metal or metal alloy and the lip area comprises a ceramic insert (30) with a high elastic modulus and low density. The hopper with the ceramic insert prevents the formation of streaks in the emulsion coating layer or layers on the support.

18 Claims, 2 Drawing Sheets

HYBRID METAL-CERAMIC COATING APPARATUS AND METHOD

This is a Continuation-in-Part of application Ser. No. 08/612,362, filed 7 Mar. 1996, now abandoned.

CROSS REFERENCE TO RELATED APPLICATION

Reference is made to and priority claimed from U.S. Provisional Application Ser. No. U.S. Ser. No. 60/005,501, filed 7 Sep. 1995, entitled HYBRID METAL-CERAMIC COATING APPARATUS AND METHOD.

FIELD OF THE INVENTION

The invention relates to cost-effective apparatus and method for emulsion coating of a photographic support. More particularly, the invention relates to such apparatus and method for forming an emulsion coating that is substantially free from streaks or other defects.

BACKGROUND OF INVENTION

There exist various methods and apparatus for coating a photographic support. One such coating system uses a bead coating hopper. Another system employs a curtain coating hopper. These systems are used in coating the surface of a support with single or multiple coatings, the latter of which can be coated simultaneously onto the support. The fabrication of photographic light-sensitive elements typically requires the simultaneous coating of multiple emulsions layered on the support.

The coating apparatus, and in particular the coating hopper, can be fabricated from various materials, the selection of which depends largely on the coating environment. To avoid the introduction of contaminants into the product and to prolong the working life of the apparatus, photographic emulsion-coating apparatus is typically fabricated from materials such as AISI 304 or 316 stainless steel which possess good resistance to corrosion and wear. Stainless steel, however, has the drawback of also possessing a high coefficient of thermal expansion, which at high coating temperatures such as at 50 to 100 degrees C. can result in non uniform coatings due to dimensional nonuniformities in the coating hopper caused by uneven thermal expansion, especially with multiple coating hoppers. Multiple hoppers comprise multiple hopper bars stacked one on another, each bar typically about 5 feet long, 6 inches wide, and 2 inches thick and having an intake slot and a discharge slot. The size and configuration of the slot opening tends to fluctuate appreciably due to changes in the emulsion coating temperature and due to bending in the coating bars caused by their weight. Also, streaks and other imperfections can be introduced into the coated layer or layers. The streaks and coating nonuniformities are often considered minor and acceptable in many non photographic coating applications. Even minor such defects, however, can be unacceptable in photographic applications, because they can lead to optical distortion in a developed photographic image that becomes even more apparent and significant upon enlargements or in products having to meet high quality standards, such as professional photographic film and paper products and motion picture film and those for graphic art.

EPA 0361167 discloses a coating apparatus fabricated from a sintered or hot-pressed ceramic material having a higher modulus of elasticity and a lower coefficient of thermal expansion than a metal such as stainless steel. A drawback, however, is that sintered and hot-pressed ceramics are porous and have other surface irregularities, which will be collectively referred to herein as "voids". Voids provide sites upon which a coating liquid can accumulate and interfere with the smooth, continuous flow of the coating liquid, thereby introducing nonuniformities and streaks into the coating layer or layers. Unlike stainless steel, the porosity of such ceramics can cause voids on the coating hopper lip where the coating or coatings flow from the hopper to the photographic support which also introduces streaks and other defects into the coating layers. Another problem caused by the presence of voids is that solidification of accumulation coating liquid in the voids causes difficulty in cleaning the coating apparatus, resulting in more out-of-service time of the equipment.

To minimize or eliminate voids, U.S. patent application Ser. No. 08/068,468 filed May 27, 1993, now U.S. Pat. 5,484,629, discloses surface treatment such as chemical vapor deposition (CVD) coating followed by grinding and lapping or a densification process hot isostatic pressing followed by grinding and lapping using hopper bars having a ceramic coating surface. Voids provide sites upon which a coating liquid can accumulate and interfere with the smooth, continuous flow of the coating liquid, thereby introducing non uniformities and streaks into the coating layer or layers.

Although ceramics, such as silicon carbide, SiC and silicon nitride, $Si_3N_4$, are more ideal emulsion coating hopper materials than metals, it is not always feasible to fabricate production size multiple bar hoppers from the standpoint of economics and having available commercial facilities large enough to accommodate such fabrication. Also from the engineering viewpoint, it is not easy to assemble a monolithic ceramic hopper using metal fasteners. Materials handling during manufacture of the hopper bars and transportation to the production site are major obstacles to produce monolithic ceramic emulsion coating hoppers. Furthermore, threaded holes needed for plumbing are not feasible in brittle ceramics. It is therefore an object of this invention is to fabricate a photographic emulsion coating apparatus and method for producing photographic emulsion coatings on polymeric support that are uniform and substantially free of streaks and are economical.

SUMMARY OF THE INVENTION

The present invention is directed to overcoming one or more of the problems set forth above. The problems inherent in metals such as high coefficient of thermal expansion, high density, and low bulk modulus can be overcome by using ceramics having lower thermal coefficient of expansion, lower density, and higher bulk modulus of elasticity. The most suitable ceramics for that would be silicon carbide and silicon nitride. The problems inherent in hard and brittle ceramics such as SiC and $Si_3N_4$ can be circumvented by using metals such as AISI 316 stainless steel. Briefly summarized, according to one aspect of the present invention, there is provided, in a coating apparatus for coating a radiation-sensitive emulsion on a photographic support, the coating apparatus comprising a coating hopper having a hopper bar comprising a hybrid metal-ceramic, the improvement wherein the hopper bars have an intake slot and a discharge slot, said bars comprising a body and hopper lip, wherein the body of the bar comprises a metal or metal alloy and the lip comprises a ceramic having a high elastic modulus and low density.

In another aspect of the invention, there is provided a method of forming a coating hopper which comprises at least one hopper bar having an intake slot and a discharge slot, said bar comprising a body and hopper lip wherein the body of the bar comprises a metal or metal alloy and the lip comprises a ceramic, said method comprising shrink fitting the ceramic lip to the metallic or metal alloy body by cooling the ceramic from room temperature to 0° C. to −196° C., sliding the ceramic over the metal and allowing the overlap of lip and body to compress.

In yet another aspect of the invention, there is provided a method of coating a photographic support with photographic coatings comprising applying the coating to said support by a coating hopper, said hopper comprising at least one hopper bar having an intake slot and a discharge slot, said bar comprising a body and hopper lip, wherein the body of the bar comprises a metal or metal alloy and the lip comprises a ceramic having a high elastic modulus and low density.

The invention yields uniform emulsion coatings that are substantially free from streaks. The hopper, and in particular the hopper lip profile, provide good coating flow stream characteristics leading to minimal discontinuities in the emulsion coating layer or layers. The coating apparatus can be easily cleaned and maintained and does not require substantial down-time in order to clean out the pores or other surface irregularities to maintain its coating efficacy. The ceramic lips provide stiffness to minimize sag and are more wear and corrosion resistant and the hybrid hopper is more cost effective.

These and other aspects, objects, features and advantages of the present invention will be more clearly understood and appreciated from a review of the following detailed description of the preferred embodiments and appended claims, and by reference to the accompanying drawings.

DESCRIPTION OF PREFERRED EMBODIMENTS

Figure 1:
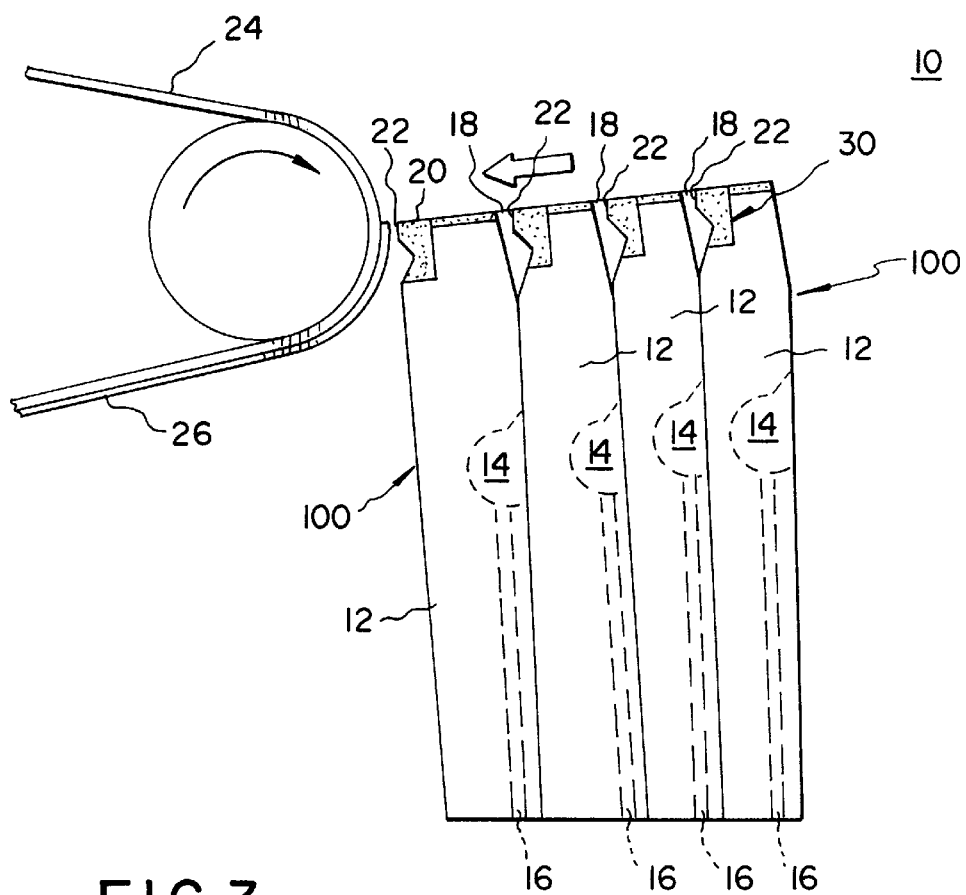
FIG. 1 is an end view of a multi-bar hopper positioned next to a moving web in accordance with the invention.

FIG. 1 illustrate a coating apparatus in accordance with the present invention. Coating hopper 10 is a multi-bar bead coating hopper comprising multiple metal hopper bars 12 that define channels 14 therebetween comprising the ceramic insert 30. A coating liquid, more particularly photographic emulsion, is provided via feed conduits 16 to channels 14. Coating liquid exits through each slot 18 and distributed uniformly by a lip 22 to form a multiple layered stream that flows along hopper coating surface 20 toward the web as indicated by the direction arrow. The stream is discharged at the ceramic lip 22 onto web 24 as it moves past lip 22, thereby forming multiple coated layers 26 onto web 24. The web 24 can be film and paper.

Ceramic insert 30 fastened to AISI 316 or 304 stainless steel or Ti or Ti—Al alloy metal bars 12 is prepared from a powder mixture, comprising a starting ceramic material and a binder. The starting ceramic material can comprises carbide, boride and nitride ceramics, such as silicon carbide, tungsten carbide, boron carbide, silicon nitride, aluminum nitride, titanium diboride, silicon-aluminum oxynitride (SiALON) or mixtures of any such ceramics. Any suitable binder, such as a wax emulsion, PVA, or PEG or acrylic, can be used. Optionally, a sintering aid, such as $SiO_2$, MgO or CaO, can be admixed with the powder mixture. To be useful the ceramic material must have a high elastic modulus and low density to make it stiffer. Useful ranges of elastic modulus are from 35 to 80 million pounds per square inch and useful ranges of density are from 2 to 6 grams/cc. It is preferable that the ceramic material on the lip have a thermal conductivity that is similar to that of the metallic hopper material and a lower coefficient of thermal expansion and higher corrosion and wear resistance than that of the metallic hopper.

The starting powder is press molded into a desired shape, as in dry pressing or cold isostatic pressing, green machined to the desired shape after which it is sintered. One skilled in the art can determine the appropriate sintering schedule and sintering atmosphere for the particular application. For example, the sintering can comprise ramping from room temperature to a first sintering temperature at a selected rate of heating, followed either by ramping at a different rate or maintaining a desired temperature, or any desired combination of such steps, until obtaining the highest desired sintering temperature. The sintered material is cooled down in a likewise fashion, and optionally quenched, to form the sintered ceramic hopper insert 30.

Figure 2:
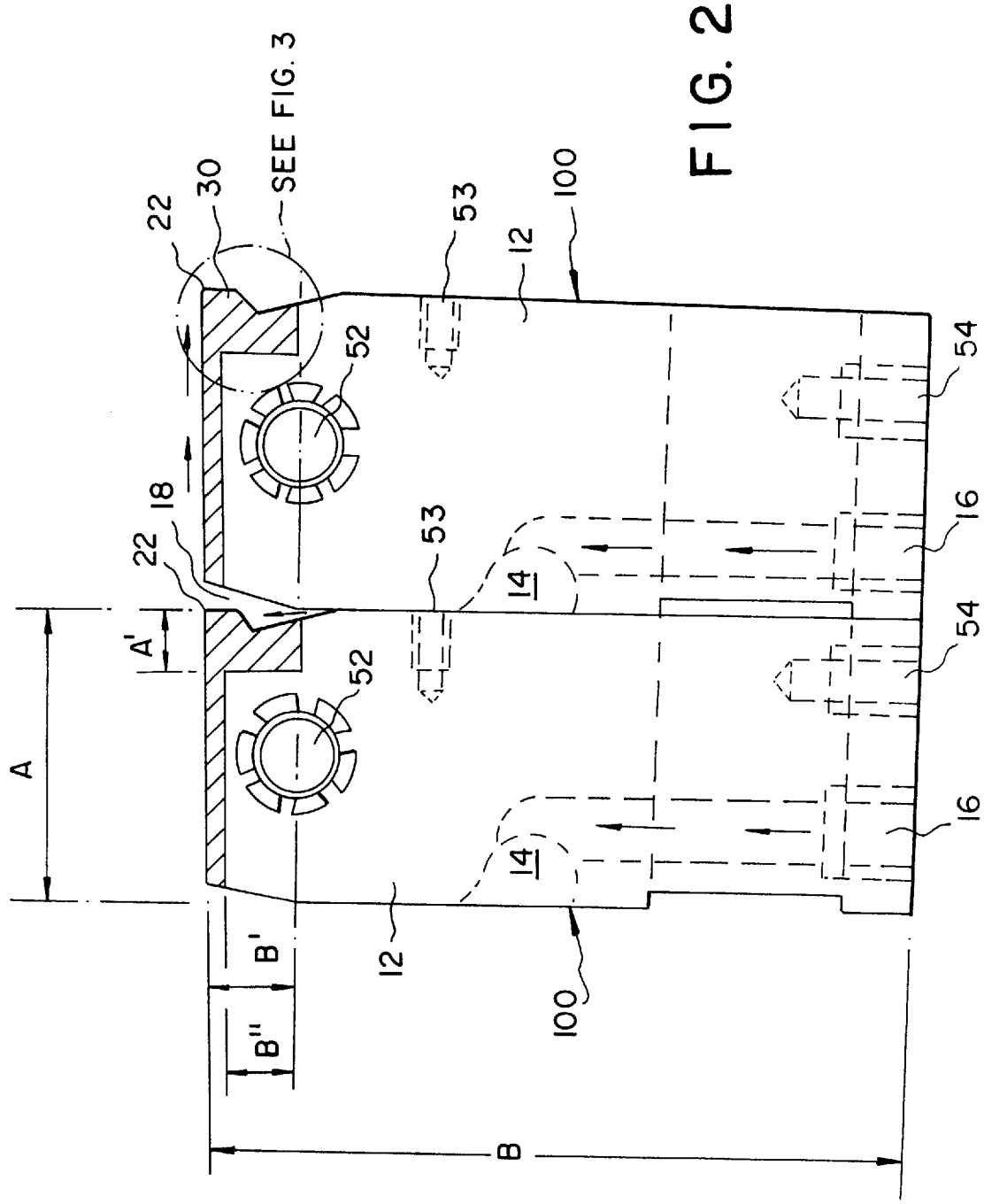
FIG. 2 is a view of a two bar hybrid coating apparatus in accordance with the invention.

FIG. 2 is a view of two bar a hybrid hopper 100 showing the ceramic insert 30.wherein the bar 12 is constructed using stainless steel or Ti or Ti-alloys. The coating liquid is pumped through the inlet conduit 16 and exit through the opening slot 18 to the ceramic lip 22. Temperature of the hopper bars is kept at selected level between 105° and 115° F. by flowing heated water through the opening 52. The hopper bars are bolted to each other and to the supporting frame using metal fasteners located at 53 and 54 respectively.

Referring to FIG. 2 again, two-metal ceramic hybrid hopper bars 100 assembled together as a two-bar hopper unit illustrates how the fluid is discharged and more particularly the function of the ceramic insert 30 comprising the discharge slot 18 and the coating lip 22. Each hopper bar intended for photographic emulsion coatings are generally 2 inches to 6 inches deep (dimension A), 6 inches to 12 inches wide (dimension B), and 30 inches to 60 inches long (not shown). The ceramic insert 30 is relatively small but important part of the hybrid metal-ceramic hopper bar 100 because the exit slot width 18 and uniformity of hopper lip 22 along the entire length determine the coating thickness uniformity and the coating quality. The ceramic insert 30 may typically have dimensions ranging from 0.5 inch to 1 inch (A') along the A dimension, about 1 inch to 3 inches wide (B') along the B dimension around the exit slot 18 and narrows down to about 0.25 inch to 0.5 inch for the remainder of the dimension A, and has a length 30 inches to 60 inches equal to the metal bar 12 itself.

It is instructive to note that the discharge (exit) slot 18 and the coating lip 22 play a very important and critical role in manufacturing defect-free and uniform multiple coatings on a running web. The ceramic coating lip 22 is designated as the edge portion (area) of the hopper bar 100 located at discharge slot 18 forming a spout through which the liquid exits the bar. The ceramic lip 22 is a part of the ceramic insert 30 of the hybrid metal-ceramic hopper bar 100. The ceramic lip 22 located closest to the running web 24 finally applies the multi-layer coatings 26 on the web as shown in FIG. 1. The exit slot 18 and the coating lip 22 are critical to the manufacture of high quality coating because they are prone to damage during the cleaning of the hopper bars. Furthermore, they are also prone to chemical corrosion because of the corrosive nature of photographic emulsions and are also subjected to wear with time that causes the change in exit slot dimension which in turn controls the coating thickness.

Metal hopper bars comprising stainless steel are prone to corrosion and are not very resistant to scratches and wear. The modulus of elasticity of stainless steel is about $30 \times 10^6$ psi as compared to $63 \times 10^6$ psi for SiC and $44 \times 10^6$ psi for $Si_3N_4$. Typical density of stainless steel is 7.8 g/cc as compared to 3.2 g/cc for SiC and 3.2 g/cc for $Si_3N_4$. Monolithic metal hopper bars tend to sag on its own weight due to gravity and that problem is accentuated more if the coating temperature varies by 5° F. A SiC or $Si_3N_4$ ceramic insert is more rigid than stainless steel or Ti-alloy (modulus about $16 \times 10^6$ psi) and lighter than stainless steel thereby minimizing the sag along the length and therefore maintaining the coating thickness uniformity. SiC and $Si_3N_4$ ceramic is harder than stainless steel or Ti-alloy and is chemically insert enabling it to be resistant to wear and corrosion. These selected ceramics also have the low coefficient of thermal expansion which help preserving the dimensional tolerance of the slot 18 as the coating temperature fluctuates.

Figure 3:
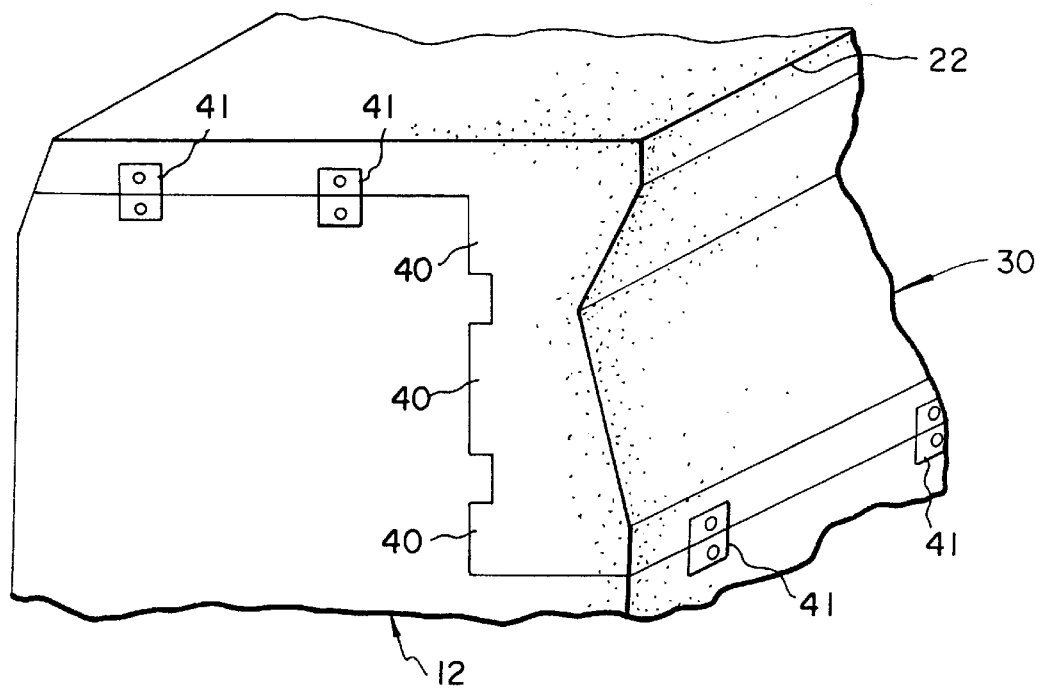
FIG. 3 is a view of the coating lip area illustrating the details of fabrication.

FIG. 3 is a view of the hybrid metal-ceramic segment around ceramic coating insert 30 showing how it is fastened to the metal counterpart 12. Matching male and female wedges are machined on the mating surfaces of the metal and ceramic parts. The ceramic insert 30 is cooled to below 0° C., between 0° and −196° C., and placed on the metal counterpart. As the bar warms up to the room temperature, the ceramic wedges expand but are restricted by the metal wedges and develop compressive stresses. The above mentioned ceramics behave better when they are in compression rather than in tension. The interference between the metal and ceramic wedges are maintained between 0.005 to 0.015 inches per linear inch to insure a strong bond. That is to say that the ceramic wedges are made 0.005 to 0.015 inch/inch larger in dimension than the slot in the metal. When the ceramic insert is cooled, the wedges shrink and easily slip into the metal slot and upon warming to the room temperature or higher, the ceramic wedges tend to grow more but are restricted physically by the metal wedges and are held there under compression. One skilled in the art can determine several other ways to insert a ceramic wedge into a metal slot for the purpose of bonding. It is also possible to use high temperature epoxy for the purpose of bonding and thus eliminate the needs of machining the wedges. Additional measures are taken to physically tie the ceramic lip with the metal bar by using metal fasteners 41. Stainless steel and Ti alloys have higher thermal coefficient of expansion than the selected carbide and nitride ceramics. As a result at the coating temperature, the metal wedges might expand more than the corresponding ceramic wedges and may weaken the bond. That is why the clearance between the ceramic and metal wedges have to be higher than that which would be necessary for room temperature operations.

An additional step in preparing the improved coating apparatus of the invention is to treat each ceramic hopper insert 30 with an initial surface finish treatment. Optionally, after sintering and before the initial surface treatment, the coating surface can be ground and/or polished if desired, such as to machine or prep the surface. In one preferred initial surface finish treatment of the invention, the insert 30 is subjected to hot isostatic pressing (HIP) by placing it in a chamber in which isostatic pressure and high temperature are maintained. Another preferred initial non-polishing surface finish treatment of the invention is a chemical vapor deposition (CVD) of a ceramic coating. A preferred CVD coating thickness is in the range of from about 0.01 inch (0.025 cm) to about 0.05 inch (0.125 cm). The CVD ceramic coating and the ceramic insert surfaces should have similar coefficients of linear thermal expansion, which can best be obtained by using a CVD material identical or similar to the ceramic surface. For example, a silicon carbide CVD coating has good deposition compatibility with a silicon carbide ceramic hopper bar insert.

The initial surface treatment such as CVD coating is followed by a final finish treatment, such as a surface grinding or polishing, in order to obtain the desired improvement in surface roughness. The treated surfaces can be mechanically finished as by grinding or lapping, or polished using an abrasive material like diamond particles. Grinding can be carried out with diamond particles in the size range of from about 2000 micro-inch (50 microns) to about 8000 micro-inch (200 microns). Lapping or polishing can be carried out with diamond particles smaller than 2000 micro-inch (50 microns). Greater improvement in surface roughness is obtained by polishing with particles as small as 10 micro-inch (0.25 micron). After the final surface finish treatment, a preferred average surface roughness is in the range of from about 2 micro-inch (0.05 micron) to about 4 micro-inch (0.1 micron).

Although FIG. 1 shows a multi-slide hopper, the coating hopper of the invention can comprise any convenient coating hopper design, such as a multi-extrusion hopper, a curtain hopper, a multi-extrusion curtain or slide hopper, or a slide-type curtain hopper, as are well known in the photographic emulsion coating art. The hopper is typically mounted on a mounting bed (not shown).

The invention has been described in detail with particular reference to a preferred embodiment thereof, but it will be understood that variations and modifications can be effected within the spirit and scope of the invention.

We claim:

1. A method of coating a photographic support with photographic coatings comprising applying the coatings to said support from a coating hopper, said hopper comprising at least two hopper bars in connection, with each hopper bar having an intake slot to intake coating material, and with a discharge slot formed between connected hopper bars for discharging coating material from the hopper bars to coat the support, wherein said each hopper bar comprises a body and a ceramic insert comprising a lip, wherein the body of the bar comprises a metal or metal alloy and the insert comprises a ceramic with an elastic modulus from 35 to 80 million pounds per square inch and a density of at least 3.2 grams/cc.

2. A method of coating as defined in claim 1 wherein the metal is stainless steel.

3. A method of coating as defined in claim 1 wherein the metal is a titanium alloy.

4. A method of coating as defined in claim 1 wherein the ceramic insert is SiC.

5. A method of coating as defined in claim 1 wherein the ceramic insert is $Si_3N_4$.

6. A method of coating as defined in claim 1 wherein the ceramic insert is overcoated with a ceramic coating by chemical vapor deposition.

7. A method of forming a coating hopper for coating photographic coatings on film or paper which hopper comprises at least two hopper bars in connection, with each hopper bar having an intake slot to intake coating material, and with a discharge slot formed between connected hopper bars for discharging coating materials from hopper bars to coat the film or paper, wherein said each hopper bar comprises a body and a ceramic insert comprising a lip wherein the body of the bar comprises a metal or metal alloy, said method comprising shrink fitting the ceramic insert comprising the lip to the metal or metal alloy body by cooling the ceramic insert from room temperature to 0° C. to −196° C., sliding the ceramic insert over the metal and allowing the overlap of insert and body to compress wherein said insert has dimensions ranging from 0.5 to 1 inch in depth and about 1 inch to 3 inches wide and a length of 30 inches to 60 inches.

8. A method of forming a coating hopper as defined in claim 7 wherein the metal is stainless steel.

9. A method of forming a coating hopper as defined in claim 7 wherein the metal is a titanium alloy.

10. A method of forming a coating hopper as defined in claim 7 wherein the ceramic insert is SiC.

11. A method of forming a coating hopper as defined in claim 7 wherein the ceramic insert is $Si_3N_4$.

12. A method of forming a coating hopper as defined in claim 7 wherein the ceramic insert is overcoated with a ceramic coating by chemical vapor deposition.

13. A coating hopper for coating photographic coatings on film or paper comprising at least two hopper bars in connection, with each hopper bar having an intake slot to intake coating material, and with a discharge slot formed between connected hopper bars for discharging coating material from hopper bars to coat the film or paper, wherein said each hopper bar comprises a body and a ceramic insert comprising a lip, wherein the body of the bar comprises a metal or metal alloy and the insert comprises a ceramic with an elastic modulus from 35 to 80 million pounds per square inch and a density of at least 3.2 grams/cc wherein the ceramic insert has dimensions ranging from 0.5 inch to 1 inch in depth, and about 1 inch to 3 inches wide and a length of 30 to 60 inches.

14. A coating hopper as defined in claim 13 wherein the metal is stainless steel.

15. A coating hopper as defined in claim 13 wherein the metal is a titanium alloy.

16. A coating hopper as defined in claim 13 wherein the ceramic insert is siC.

17. A coating hopper as defined in claim 13 wherein the ceramic insert is $Si_3N_4$.

18. A coating hopper as defined in claim 13, wherein the ceramic insert in overcoated with a ceramic coating by chemical vapor deposition.

* * * * *